US008222887B2

(12) United States Patent
Gonnet

(10) Patent No.: US 8,222,887 B2

(45) Date of Patent: Jul. 17, 2012

(54) PROCESS FOR MEASURING PEAK VALUES AND POWER OF AN AUDIO FREQUENCY SIGNAL

(75) Inventor: Camille Gonnet, Lyons (FR)

(73) Assignee: Sound4, Lyons (FR)

( * ) Notice: Subject to any disclaimer, the term of this patent is extended or adjusted under 35 U.S.C. 154(b) by 357 days.

(21) Appl. No.: 12/700,115

(22) Filed: Feb. 4, 2010

(65) Prior Publication Data

US 2010/0213923 A1 Aug. 26, 2010

(30) Foreign Application Priority Data

Feb. 5, 2009 (FR) ..................................... 09 50728

(51) Int. Cl.
*G01R 19/04* (2006.01)
*G01R 23/00* (2006.01)

(52) U.S. Cl. ................................ 324/103 P; 324/76.19

(58) Field of Classification Search ............... 324/76.19, 324/76.12, 76.11, 103 R, 103 P; 73/770, 73/646; 702/61, 60, 57, 1
See application file for complete search history.

(56) References Cited

U.S. PATENT DOCUMENTS 3,594,504 A * 7/1971 Munson .......................... 73/646
3,896,375 A * 7/1975 Trolliet ...................... 324/103 P
3,949,294 A * 4/1976 Imura ........................ 324/103 P
4,388,590 A * 6/1983 Richards et al. ........... 324/103 P
4,398,061 A 8/1983 McMann, Jr.
5,847,558 A * 12/1998 McGuire et al. ........... 324/76.13
7,574,010 B2 * 8/2009 Forrester et al. .............. 381/104
2006/0278066 A1 * 12/2006 Ognibeni ........................ 84/723
2008/0225175 A1 * 9/2008 Shyshkin et al. ............. 348/572
2010/0025545 A1 * 2/2010 Koval ............................ 246/107

FOREIGN PATENT DOCUMENTS

WO WO 93/09531 5/1993

OTHER PUBLICATIONS

French Search Report dated Nov. 30, 2009.

* cited by examiner

*Primary Examiner* — Hoai-An D Nguyen
(74) *Attorney, Agent, or Firm* — RatnerPrestia

(57) ABSTRACT

The process for measuring peak and power values of an audiofrequency signal S including digitization of the original signal, calibration of the digitized signal, determination of update instants of the measurements of the signal on the basis of a criterion associated with the value of the signal itself, setting of a fast sequence for measuring the peak of the digitized and calibrated signal, setting of a fast sequence for measuring the power of the digitized and calibrated signal, acquisition of representative peak and power measurements of the digitized and calibrated signal according to the update instants of the signal, optimization of the fastness of the measurement according to the nature of the digitized and calibrated signal, optimization of the pertinence of the measurement on a digitized and calibrated, broad-band signal of a large dynamic range.

16 Claims, 6 Drawing Sheets

PROCESS FOR MEASURING PEAK VALUES AND POWER OF AN AUDIO FREQUENCY SIGNAL

This application claims priority of French Application No. 09 50728 filed on Feb. 5, 2009. The contents of which are incorporated herein by reference.

FIELD OF THE INVENTION

The present invention belongs to the field of signal processing processes. More specifically, it pertains to a process for measuring an audiofrequency signal.

BACKGROUND

In the field of broadcasting radio and television programs, the sound part of the program is the subject of various processings and manipulations of the signal. These processes are designed, on the one hand, to prevent any exceeding of thresholds regulated in terms of electric level, and, on the other hand, to obtain a subjective form of the sound texture in order to give a sound identity to the broadcast programs and/or a higher sound power impression than that of the competition.

The different processes for modifying an audiofrequency signal are numerous and varied, and the range of effects, such as the pallet of optimizing these effects, are developing rapidly.

Basically, modifying a sound signal requires knowing, above all, the exact characteristics of the original sound signal.

Therefore, it is indispensable to qualify this original audiofrequency signal by evaluations, measurements, analyses, to obtain the maximum characteristics of the signal at a given instant to decide on the nature of the modifications that must be made to the signal at this instant in order to achieve the objective set by the conversion process (for example, higher sound power impression, etc.).

The quality of the processing (effectiveness, absence of any audible distortions, low latency time, etc.) is therefore linked to two essential parameters:

The quality of the measurement of the original signal,

The quality of the processings carried out after the measurement and depending on the results of same.

Many audiofrequency processing devices designed for radio or television (regardless of the broadcasting mode: Hertzian, satellite, cable, internet network or others) are known in the prior art. These have proved to be limited in the development of their functionalities and in the improvement of the quality of the processings because of the mediocre quality of the measurements supposed to rigorously represent the original signal. The existing audio signal processing devices have therefore reached a technological stage limited by the performance of the process for measuring the original audio signal.

The techniques used by these devices to ensure the measurement of an audio signal, in order to obtain representative data, are commonly based on an analog evaluation of the signal (especially by successive mean value methods).

Sophisticated processes have been used to overcome the existence of these imprecisions in the measurement of the original audio signal. However, they do not make it possible to obtain reliable and stable results on the entire audio spectrum or on the entire dynamic range of the signal, resulting in the appearance of audible distortions and of “false friends” (artifacts) triggering unexpected processings of the signal.

Other prior-art audio signal processing devices use a technique in which the original signal is rather simply evaluated, and the “corrective” processes are applied to the processed signal. Thus, if on such a signal pattern it is known that the measurement performed upstream is affected by a nonlinearity, a corrective is used on the processed signal to limit the amplitude of the processing affected by the poor starting evaluation of the original audio signal.

However, this method, adapted in always identical particular cases, fails when the sound programs are highly varied (classical music then modern music, for example). Therefore, it is not polyvalent.

Finally, in “high end” audio processing equipment, processes are known which combine the two methods according to essentially empirical weightings, which prove to be extremely delicate to use during operations of installing and adjusting the equipment.

It is seen that the prior-art solutions are not satisfactory because of existing errors on the measurements of the original signal, which are never corrected perfectly.

SUMMARY OF THE INVENTION

The object of the present invention is thus to solve the problems identified above by proposing a novel process for measuring the original audio signal, which is not marred by the errors of the prior-art processes.

A second object of the measurement process is fastness.

For this purpose, the present invention proposes a process for measuring the peak and power values of an audiofrequency signal, comprising the steps:

101: digitization of the original audio signal,

102: calibration of the signal in a template compatible with the perimeter of measurement needed for management of the audio processing,

103: determination of update instants of measurements of the signal based on a criterion associated with the value of the signal itself,

106: acquisition of representative measurements of the signal according to update instants of the signal.

It is understood that the present invention proposes to approach the problem of measuring the peak level of an audio signal in a manner opposite the processes of the prior art.

In fact, rather than optimize the measurement systems and/or compensate the perverse effects caused by same on the subsequent operations of processing the audio signal, the present process measures the original signal in an extremely precise manner.

The principle is to use measurement intervals of a variable duration instead of measurement intervals of a fixed duration as in prior-art techniques (which use successive mean value methods).

According to various preferred embodiments, optionally used in conjunction, the process also includes steps:

107: optimization of the fastness of the measurement according to the nature of the digitized and calibrated signal,

104: setting of a fast sequence of measuring the peak of the digitized and calibrated signal,

105: setting of a fast sequence of measuring the power of the digitized and calibrated signal,

109: restitution of the measurement values in synchronism with the original signal.

In a preferred embodiment, the process includes a step 108, optimization of the pertinence of the measurement on a broad-band signal with a large dynamic range, as well.

This device corresponds to prevent the peak measurement from following the pattern of the signal too quickly, when same has a strong dynamic range.

The original audio signal is preferably digitized by formatting the signal in the form of a I2S flux at a frequency of 192 kHz, corresponding to a coding of its stereo on 24 bits.

According to a preferred embodiment, the calibration step includes the parts:

using a low-pass type filter circuit with finite impulse response type filter, using a high-pass type filter circuit with infinite impulse response type filter, a Bessel type filter.

According to a preferred embodiment of the process, in a step of determining update instants of measurements, any passage to zero of the digitized and calibrated audio signal $S_{I2s-C}$ is detected and the instant during which this state occurs is stored as an update instant of the measurements.

Preferably, in the step of setting a very fast peak measurement sequence, the digitized, calibrated audio signal $S_{I2s-C}$ is rectified to obtain only positive alternations, the peak measurements are synchronized on passages to zero of the digitized and calibrated signal $S_{I2s-C}$ by storing the peak of the signal on the half-alternation preceding the update instant of the peak measurement.

According to a preferred embodiment, in the step of setting a very fast sequence of measuring the power of the signal, the squares of the digitized and calibrated signal $S_{I2s-C}$ are cumulated, over a given duration, by storing the cumulation time, the power measurements are synchronized on passages to zero of the digitized and calibrated signal $S_{I2s-C}$ by storing the cumulation of squares and the duration on the half-alternation preceding the update instant of the power measurement.

According to a preferred embodiment, in the step of performing representative measurements of the audio signal, according to the update instants of the signal, the calculation of the peak levels of the signal and the calculation of the instantaneous power of the audio signal are performed in a synchronized manner, and in that the power is measured by calculating the square root of the ratio of the cumulation of squares to the time of the half-alternation.

According to a preferred embodiment, in the step of optimization of the fastness of the measurement according to the nature of the audio signal, the measurements of peaks and results of the power calculations of the last X alternations are stored, a test is then implemented based on a decision criterion, implying that the measurement that is retained is made up of the maximum value, between the partial measurement value during the calculation (instant T) and the value of the measurement of the preceding half-alternation.

According to a particular embodiment, in the step of optimization of the pertinence of the measurement on a broadband audio signal with a large dynamic range a table of measurements is used, preserving the traceability of the last M measurements of half-alternations, for the peaks, the maximum measurement of this entire table is always preserved, for the power, it is calculated on the entire table by taking the square root of the ratio of the cumulation of squares of the signal to the time of this entire period, the measurement of the time of the last validated half-alternation (Tv) is preserved, a conditional function is used such that if the new measurement represents a time T less than half Tv, then M is increased by 1; if not, M is reinitialized to 1 and the device initializes an entirely new measurement.

According to an advantageous embodiment, in the step of restitution of the measurement values in synchronism with the original signal, the timing clock of the means for digitizing the original signal is used to arrange markers making it possible to identify and synchronize the tables of measurements with the original digitized signal $S_{I2s}$.

BRIEF DESCRIPTION OF THE DRAWINGS

The present invention also aims at a computer program product comprising program code instructions recorded on a support readable by a computer for implementing the steps of the process as described above when the said program runs on a computer.

The description that follows, given only by way of example of an embodiment of the present invention, is provided by referring to the attached figures, in which.

DETAILED DESCRIPTION

Figure 1:
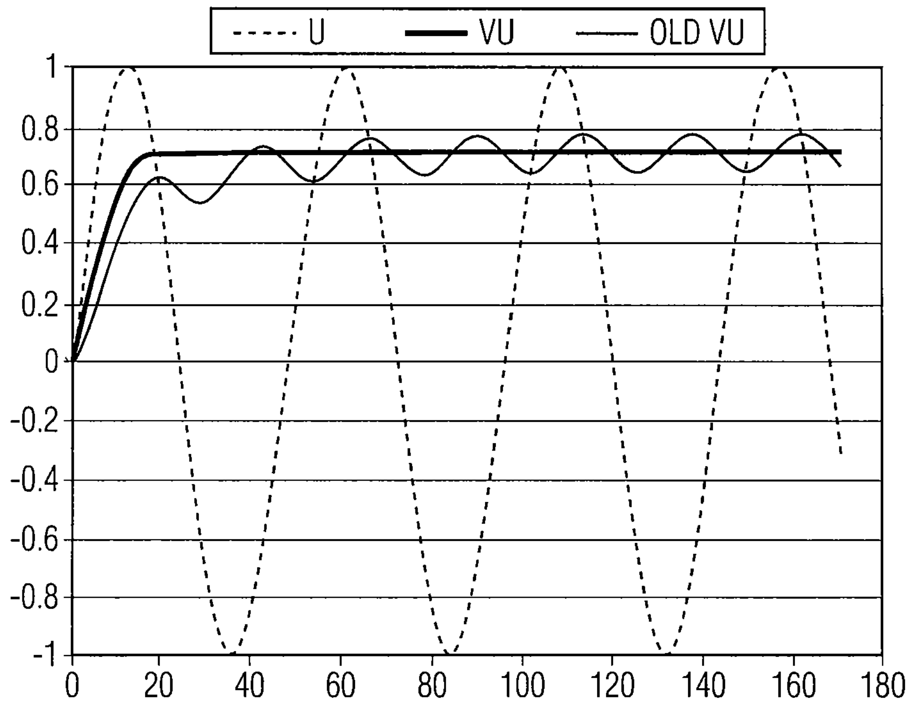
FIG. 1 is a graph of a measurement of the power of a low-frequency (on arbitrary scales) sinusoidal signal.

The process according to the present invention is designed to be used with software (it may also be microcoded to improve its processing speed), monitoring a set of electronic circuits. Thus, it is used, for example, on a standard PC type microcomputer, provided with prior-art communication interfaces, and in particular an audio signal input interface of a type known to the person skilled in the art.

The process uses a plurality of consecutive actions (divided into a few principal steps) based on complementary techniques making it possible to guarantee a pertinence excellence thanks to a synchronized monitoring of the actions.

In a preliminary step, an initial, classical type, stereo audiofrequency signal S is presented to the device in any form, known per se and going beyond the framework of the present invention.

The process may thus be described in nine principal steps:

The goal of the first step 101 is to digitize the stereo audiofrequency signal S by coding it in the form of an I2S type flux $S_{I2s}$ at 192 kHz.

It is recalled that I2S is a data series bus interface standard that is used for the connection of devices processing audio signals.

The I2S (abbreviation of Integrated Interchip Sound) format is, for example, commonly used to carry a PCM (Pulse-Code Modulation) signal between the CD reading device and a digital/analog converter (DAC). The I2S format is characterized, among other things, in that it separates the clock and data signals, which reduces the jitter phenomena, i.e., involuntary signal fluctuations that result in errors in the existing signal. The I2S standard and its use are known to the person skilled in the art and are therefore not described in further detail in this specification.

It is clear that the frequency of 192 kHz (typical frequency of a high-definition stereo audio interface sampled on 24 bits) is given here by way of a nonlimiting example. Any other frequency might be used depending on the specific characteristics of the signal to be processed or the changes in the technique.

In the first place, AES3 (digital audio standard, which is used to transport the audio signal among various devices) type, dedicated circuits, specifically controlled, in a manner known per se, are used to carry the initial audio signal S.

Then, analog/digital, controlled, codec type (coders/decoders) circuits are used to perform the task of digitization of the signal S in the form of a signal $S_{I2s}$ in I2S format. The control of these circuits with a view to obtained the anticipated result is known to the person skilled in the art.

The goal of the second step 102 is to calibrate the digitized signal $S_{I2s}$ in I2S format in a template compatible with the perimeter of measurement needed for the management of the audio processing without loss of useful data and without alteration of the signal in terms of phase and in terms of harmonic distortion: (THD: Total Harmonic Distorsion).

In a first part of this step 102, a low-pass type filter circuit is used.

In the present example, the filter has a cutoff frequency of 22 kHz, an attenuation of −80 dB at 26 kHz, without phase rotation, and a residual ripple in the band lower than 0.01 dB. To do this, an FIR (Finite Impulse Response) type digital filter is used.

The second part of this step 102 consists in using a high-pass type filter circuit.

In the present example used in a nonlimiting manner, a filter with a cutoff frequency of 1 Hz, a maximum phase rotation of 5 degrees at 20 Hz for a maximum attenuation of 0.05 dB at 20 Hz is used to cut off a possible continuous component. An IIR ("Infinite Impulse Response") filter, a Bessel type filter, is used for this part.

The two types of digital filters used and their use are known per se.

The result of this second step 102 is a digitized, calibrated signal $S_{I2s-C}$.

The goal of the third step 103 is to determine the update instants of the measurements of this digitized and calibrated signal $S_{I2s-C}$ to prevent any oscillation during the measurement procedure.

To this end, any passage to zero of the digitized and calibrated audio signal $S_{I2s-C}$ is detected, and the instant during which this state occurs is stored as an updated instant of the measurements. This storage is done in an ad-hoc data base, which is created in a conventional manner.

In the fourth step 104, which processes the peak of the digitized and calibrated audio signal $S_{I2s-C}$, an attempt is made to guarantee a maximum fastness of the sequence of measurement of the peak of the digitized and calibrated signal $S_{I2s-C}$ so as not to generate integration or significant delay between the real value of the signal and its measured value at the instant T.

The first phase in this fourth step 104 is to rectify the digitized and calibrated audio signal $S_{I2s-C}$ in order to obtain only positive alternations (a signal is created whose value at each instant is the absolute value of the original digitized and calibrated signal $S_{I2s-C}$).

In a second phase, the peak measurements are synchronized on the passages to zero of the digitized and calibrated signal $S_{I2s-C}$ by storing the peak of the signal on the half-alternation preceding the update instant of the peak measurement.

Analogously, the goal of the fifth step 105 (carried out simultaneously with step 104), which processes the power of the digitized and calibrated audio signal $S_{I2s-C}$, is to guarantee a maximum fastness of the sequence of measurement of the power of the digitized and calibrated signal $S_{I2s-C}$ so as not to generate integration or significant delay between the real value of the signal and its measured value at the instant T.

The first phase in this fifth step 105 is to cumulate the squares of the digitized and calibrated signal $S_{I2s-C}$, for a given duration, by storing the cumulation time.

Then, the power measurements are synchronized on the passages to zero of the digitized and calibrated signal $S_{I2s-C}$ by storing the cumulation of squares and the duration on the half-alternation preceding the update instant of the power measurement.

The goal of the sixth step 106 is to effectively perform representative measurements of the audio signal according to the update instants of the signal.

The peak levels of the digitized and calibrated signal $S_{I2s-C}$ are calculated by complying with the procedure of step 104.

Simultaneously, the instantaneous power of the digitized and calibrated audio signal $S_{I2s-C}$, is calculated according to the procedure of step 105. The square root of the ratio of the cumulation of squares to the time of the half-alternation is calculated.

In a seventh step 107, the fastness of the measurement is optimized according to the nature of the audio signal.

This step begins with a storage of the measurements of the peaks and the results of the power calculations of the last X alternations.

A test is then implemented based on a decision criterion, implying that the measurement that is retained is made up of the maximum value, between the value of the partial measurement during the calculation (instant T) and the value of the measurement of the preceding half-alternation.

This test is applied to the measurements of the peaks and to the calculations of the power of the audio signal.

And optionally, but preferably, in an eighth step 108, the pertinence of the measurement is optimized for taking into account cases of broad-band audio signal with a large dynamic range.

In fact, in the case of this particular type of audio signal, the sum of low frequencies and high frequencies may generate insignificant passages to zero of the signal, when the audio signal is close to a zero level. These insignificant passages to zero will interfere with the normal running of the process and reduce its performance. In this step,

- a table of measurements is used preserving the traceability of the last M measurements of half-alternations,
- for the peaks, the maximum measurement of this entire table is always preserved,
- for the power, it is calculated on the entire table by taking the square root of the ratio of the cumulation of squares of the signal to the time of this entire period.

the measurement of the time of the last validated half-alternation (Tv) is preserved, a conditional function is used such that if the new measurement represents a time T less than half Tv, then M is increased by 1; if not, M is reinitialized by 1 and the device initializes an entirely new measurement.

A ninth step consists of restituting the values of the measurements in synchronism with the original digitized signal $S_{I2s}$.

To do this, the timing clock of the acquisition system (I2S digitization circuit of step 101) is used to arrange the markers, making it possible to identify and synchronize the measurement tables with the original digitized signal $S_{I2s}$.

These measurement tables may then be used to inform, command or trigger various different audiofrequency signal processing devices. These devices go beyond the framework of the present invention.

FIGS. 1 through 12 illustrate the measurement quality of a signal, provided by the process according to the present invention (with or without taking step 108 into account), and improvement of performances obtained compared to prior-art processes.

FIGS. 1 through 6 illustrate a measurement of the power of an audiofrequency signal. The following notations are used in these figures:

U: original audio signal

Old VU: result of the measurement obtained with a traditional system

Simple: result of the measurement obtained with the novel process using the basic method, with the improvement of the detection fastness, but without optimizing the pertinence (according to step 108)

VU: result of the measurement obtained with the novel process using all the devices.

FIG. 1 is a graph illustrating the measurement of the power of a low-frequency (arbitrary scales) sinusoidal signal. It is seen in this figure that measurement of the power (VU) of the audio signal is obtained quasi exactly by the process according to the present invention from the first half-oscillation and remains stable starting from this moment.

By contrast, the measurement performed by the traditional process (Old VU) has a plurality of errors: it does not converge towards a stabilized value, but oscillates around the exact value.

Figure 2:
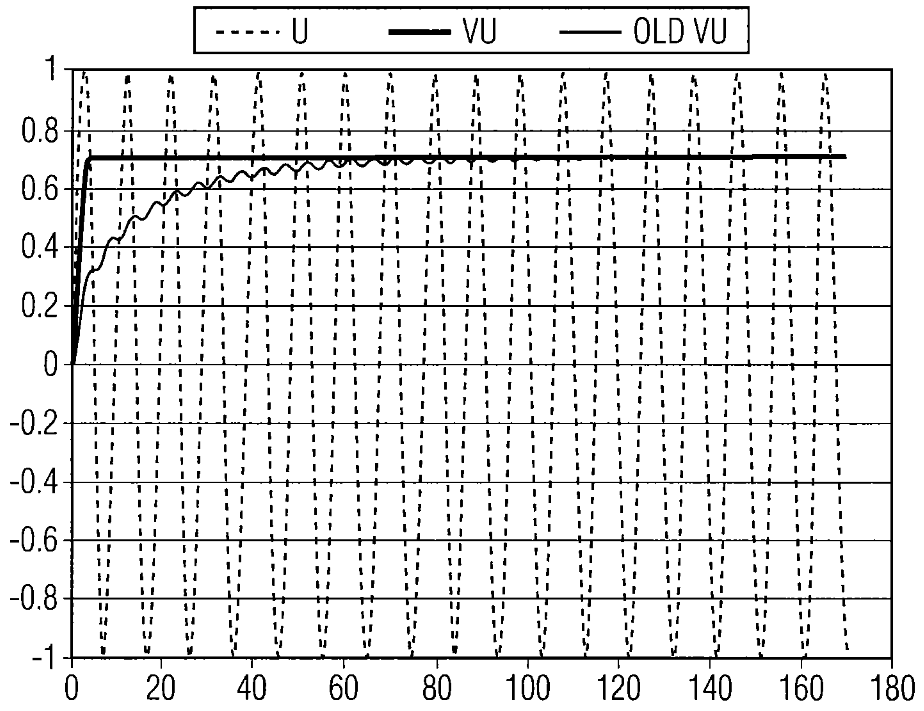
FIG. 2 is likewise a graph of a measurement of the power of a high-frequency sinusoidal signal.

FIG. 2 likewise shows a measurement of the power of a high-frequency sinusoidal signal. The same phenomena are seen in this case, with a build-up time of the value measured by the traditional process (three oscillations to reach about 75% of the real value) that is clearly longer than by the process according to the present invention (VU), which converges in a half-oscillation and remains stable starting from this moment.

Figure 3:
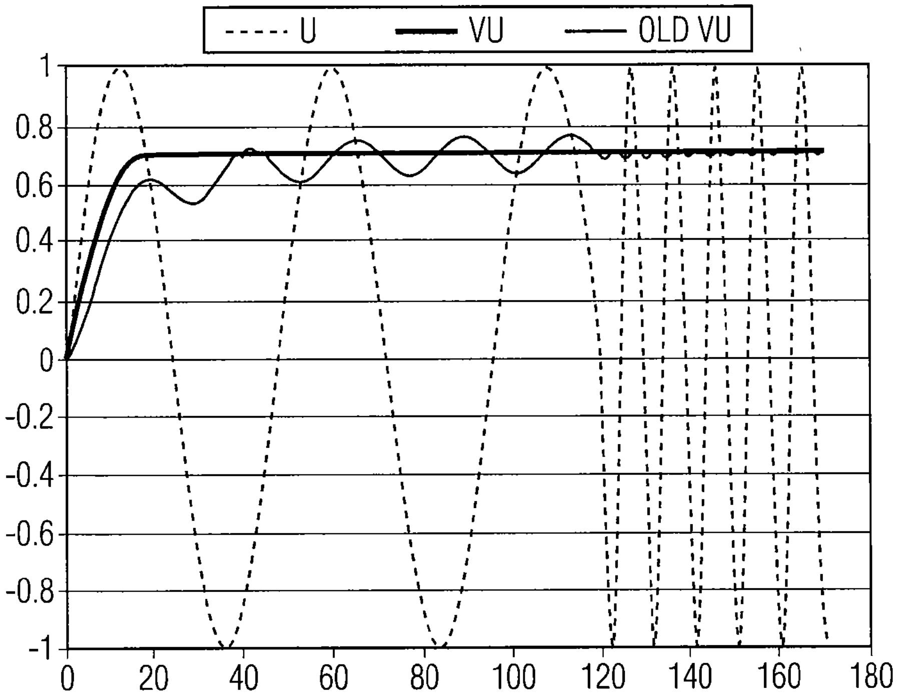
FIG. 3 is likewise a graph of a measurement of the power of a low-frequency and then high-frequency sinusoidal signal.

FIG. 3 likewise shows a measurement of the power of a low-frequency, then high-frequency sinusoidal signal.

FIGS. 1 through 3 clearly show the difference between the traditional method (Old VU) and the proposed method (VU).

In the traditional method, if the time constant increases, the rippling shall be reduced, but the arrival at the exact value shall prove to be longer.

In the novel process, not only is no rippling observed, but the exact value is obtained immediately after the end of the first half-alternation and then remains perfectly stable.

Figure 4:
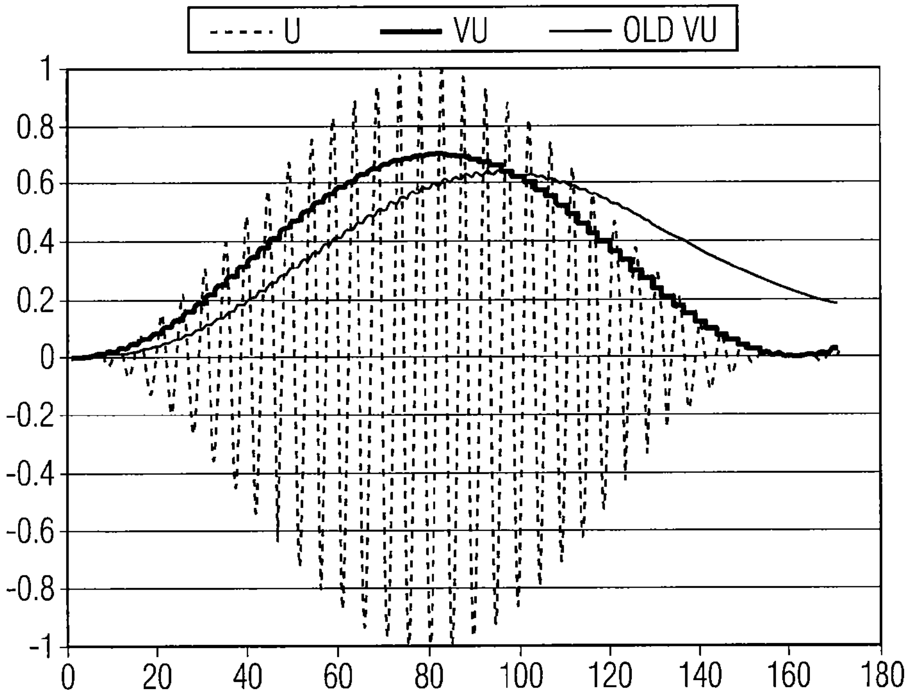
FIG. 4 is a graph demonstrating the problem with the time for establishing the traditional measurement.

FIG. 4 illustrates the case of implementing the process in the case of a "burst" type signal. It demonstrates the problem with the time of establishing the traditional measurement. The process according to the present invention does not pose this type of problem.

Figure 5:
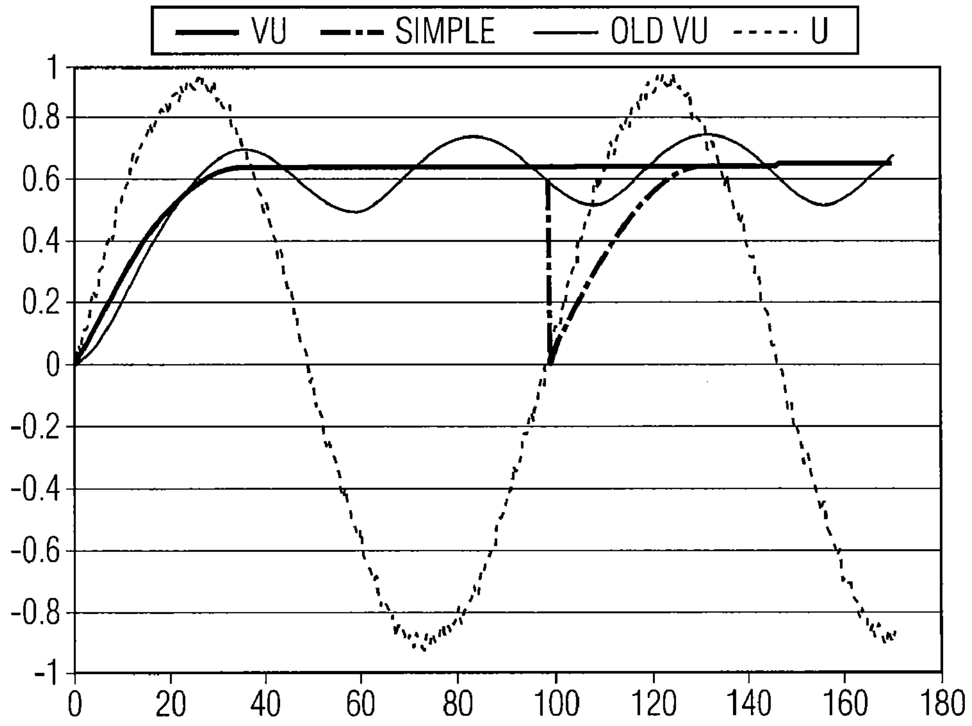
FIG. 5 is a graph illustrating the novel process in its basic version compared to the entire novel process integrating the device of step 108.

FIG. 5 makes possible a comparison of the process according to the present invention without step 108 and the entire process integrating step 108.

This figure demonstrates the problem with the basic proposal formulated in step 108 of the specification. The basic method (before step 108, here corresponding to the "Simple" curve) passes to zero again when the high frequencies (noise) generate successive, nonpertinent passages to zero. The proposed method of improving the pertinence is measured here on the curve called VU. It is seen that the noise then no longer disturbs the measurement, which remains very stable.

Figure 6:
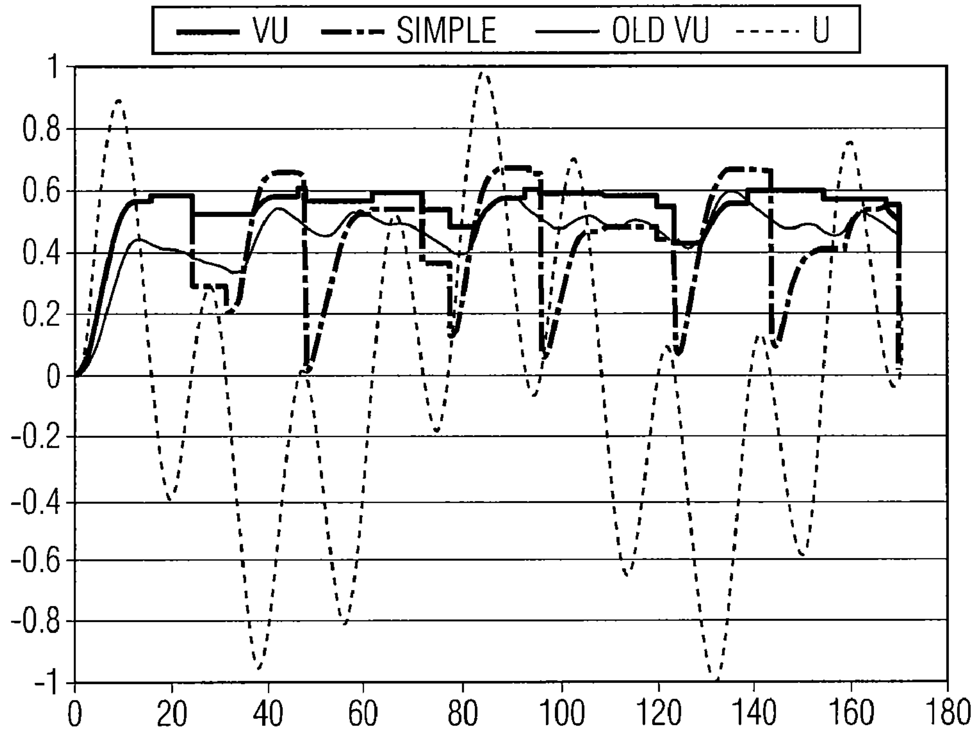
FIG. 6 is a graph illustrating the case of a complex signal and of the result obtained by the process in its different versions.

FIG. 6 is another example demonstrating problems caused by the process without the use of step 108 in the measurement of the power and again showing the advantages of improving the pertinence. The comments on FIG. 5 apply. It is seen that the entire process brings about a quasi exact measurement of the power value of the signal, while the traditional process remains far from the real value of the power of the signal. In this example, the power VU measured by the process with improvement of pertinence (step 108) is always clearly more exact than the power (Old VU) measured by the traditional processes (its error compared to the real power is only by a few percent instead of close to 20% by the prior-art methods).

As for FIGS. 7 through 12, they illustrate the measurement of the peak levels of an audiofrequency signal by the process according to the present invention. The following notations are used in these figures:

U: original audio signal (on a scale for which 1 is the maximum power value of the signal)

abs(U): absolute value of the original audio signal

Old Peak: result of the measurement obtained with a traditional system

Simple: result of the measurement obtained with the novel process using the basic method, with the improvement of the detection fastness, but without optimizing the pertinence (before step 108)

Peak: result of the measurement obtained with the novel process using all the devices.

Figure 7:
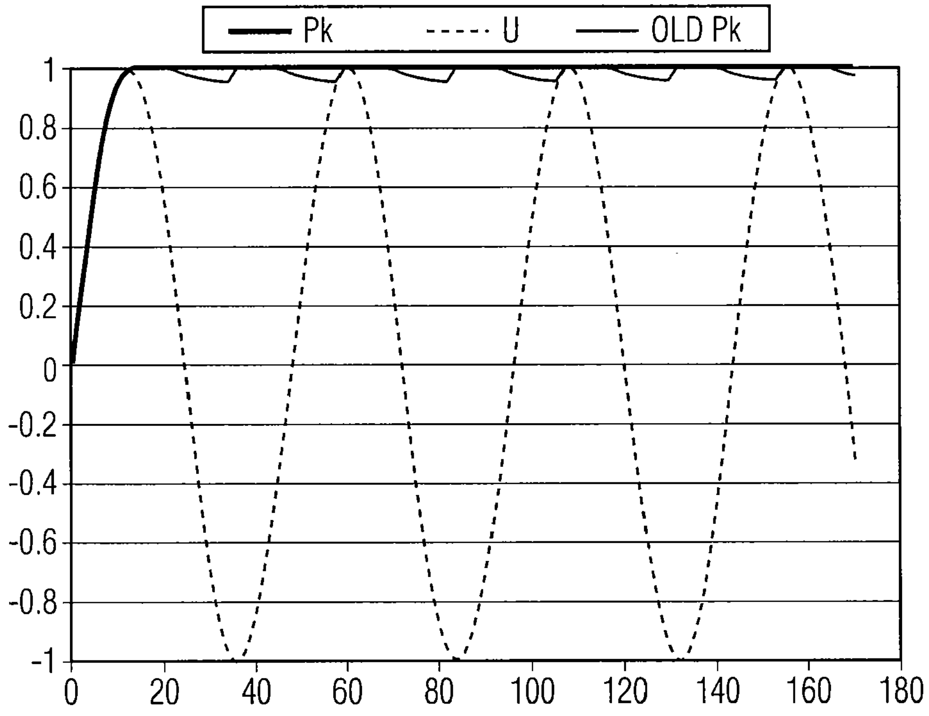
FIG. 7 is a graph of a peak level measurement of a low-frequency sinusoidal signal.

FIG. 7 is a graph of a measurement of the peak level of a low-frequency sinusoidal signal by the prior-art processes (Old Peak) and by the process according to the present invention (Peak). It is seen here that the measurement by the process according to the present invention (Peak) yields a quasi exact value from the first peak and then remains stable at this value. By contrast, the peak value obtained by the traditional process (Old Peak) varies over time by a few percent at each half-oscillation and never stabilizes.

Figure 8:
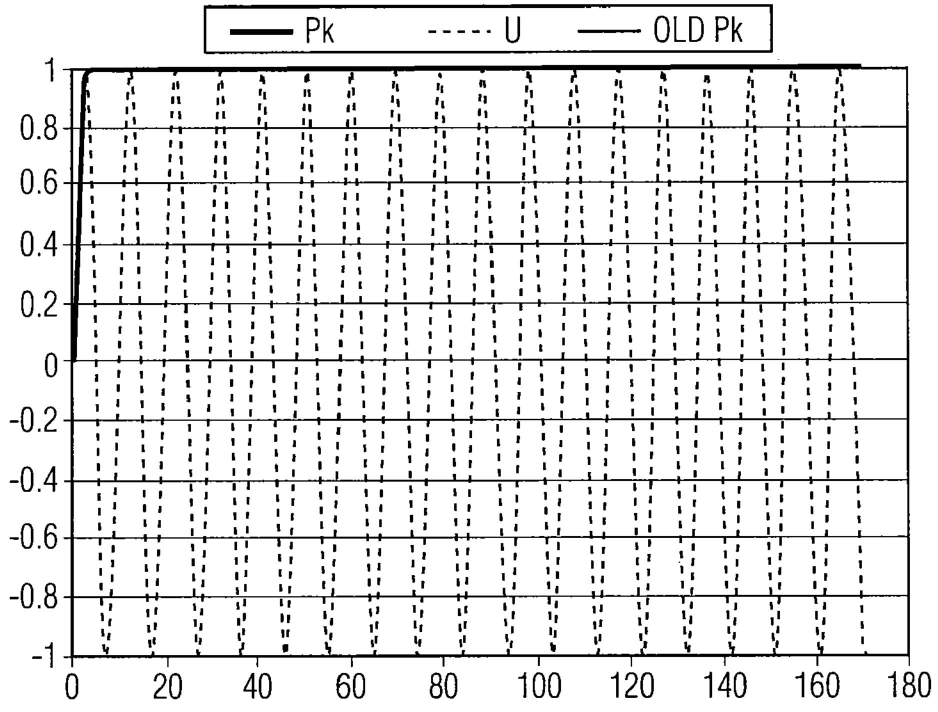
FIG. 8 is a graph of a peak level measurement of a high-frequency sinusoidal signal.

In the same manner, FIG. 8 shows a measurement of the peak level of a high-frequency sinusoidal signal. It is also seen that the measurement by the process according to the present invention (Peak) reaches a value that is stable and very close to the real peak level starting from the first peak. In this figure, as in the preceding one, there is no difference between the Peak (complete process including step 108) and Simple values (simplified process, without this step 108). By contrast, in a high-frequency signal, the lack instability of the measurement according to the prior-art process (Old Peak) is less marked.

Figure 9:
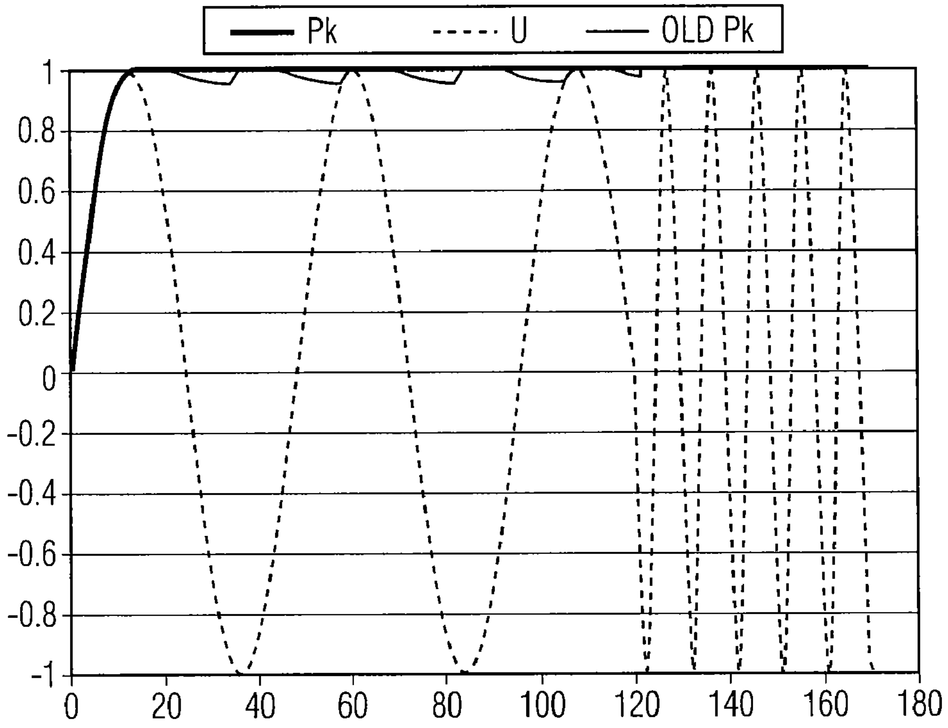
FIG. 9 is a graph of a peak level measurement of a low-frequency, then high-frequency sinusoidal signal.

FIG. 9 illustrates a measurement of a peak level of a low-frequency, then high-frequency sinusoidal signal. The phenomena noted in FIGS. 7 and 8 are found here again.

Figure 10:
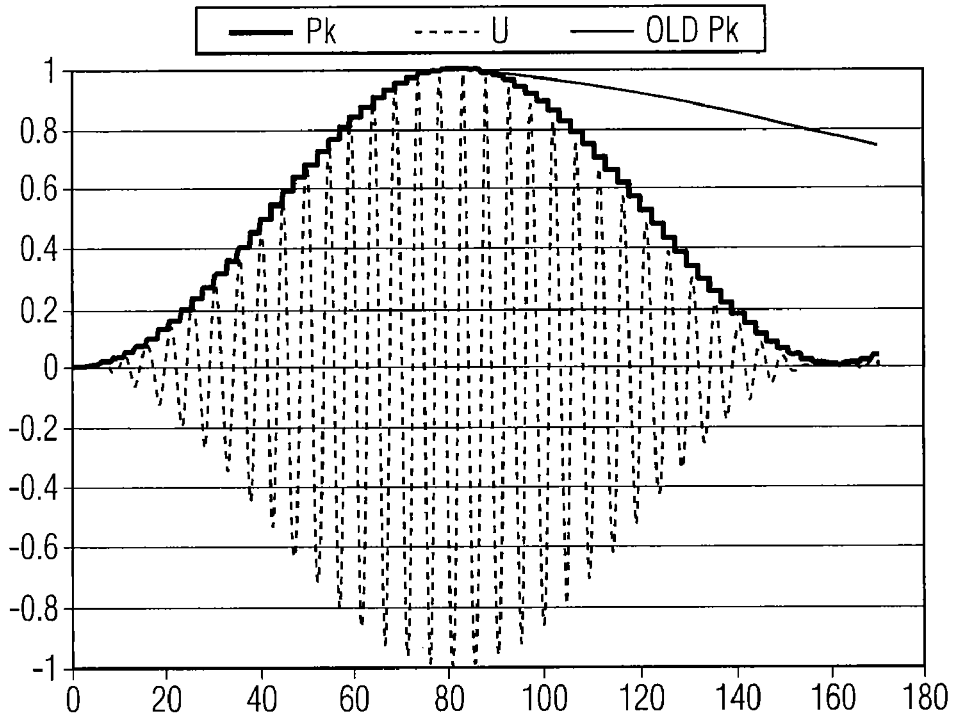
FIG. 10 is a graph of a peak level measurement of a "burst" type signal.

FIG. 10 illustrates the measurement of a peak level of a "burst" type signal. It is seen in this figure that the peak measurement value obtained by a prior-art process (Old Peak) correctly follows the build-up of the signal, but takes a long time to overtake the lowering of the signal. By contrast, the measurement performed by the process as described (Simple and Peak curves) quickly overtakes the real peak value, providing a clearly more reliable measurement for devices arranged downstream for processing the audio signal.

Figure 11:
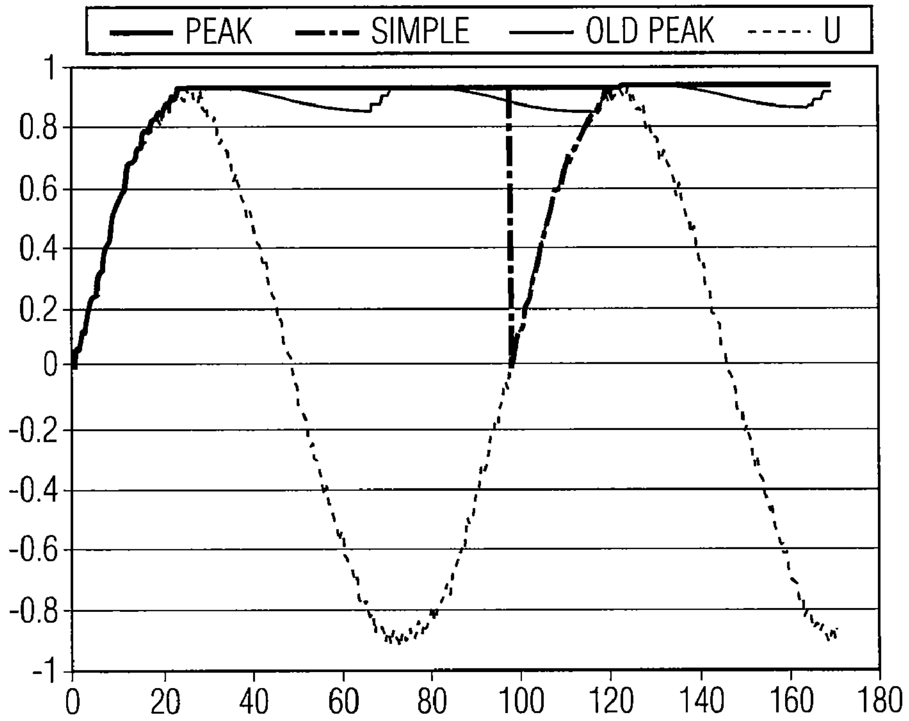
FIG. 11 is a graph of the novel basic process compared to the entire novel process integrating the device of step 108.

FIG. 11 illustrates the case of a noise signal. In this case, the basic process (Simple, without step 108) "disconnects" at the end of a complete period, and then overtakes the peak value. After taking into account step 108, optimization of the pertinence, the measured value (Peak) does remain stable at the quasi exact peak value of the signal, while the value measured by a traditional process (Old Peak) never stabilizes.

Figure 12:
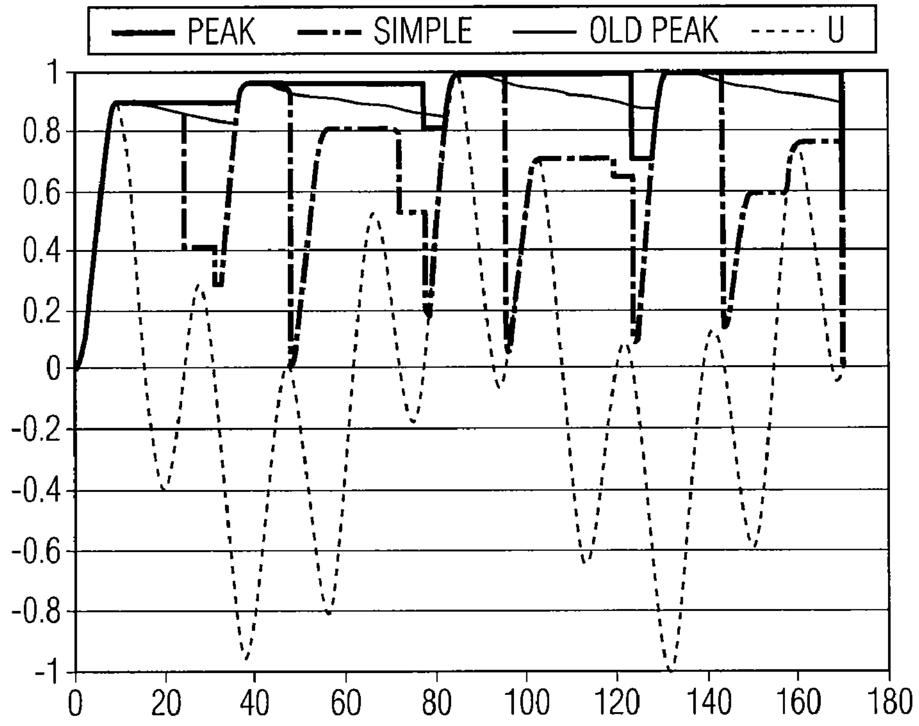
FIG. 12 shows another example of measurement on a signal.

Finally, FIG. 12 illustrates another example of a more complex audio signal, which demonstrates the problems caused by the basic solution in the measurement of the peak level. In fact, because of the passages to zero caused by the noise in the signal, this measurement (Simple) is re-initialized almost at each complete oscillation (passage to zero) and therefore becomes the peak value (absolute value) of the last half-oscillation observed instead of measuring the real peak value of the signal.

The introduction of step 108, improvement of pertinence (Peak), reduces this phenomenon very significantly.

The process as described has a certain number of advantages, including:

1. A reliability and good reproducibility of the measurements.

2. A simplicity of implementing all the actions, using existing devices.

3. The possibility of integrating the measurement process according to the present invention in new generations of equipment without challenging the types and forms of audiofrequency signal processing processes already developed by players on the market.

4. The suppression of optimization and qualification error compensation devices of the original signal. This is expressed as gains in terms of components and energy, i.e., cost. The second advantage induced by this suppression of correction devices is the obtaining of improved performances thanks to faster calculations making possible a significant reduction in the latency time of the measurement system.

5. The possibility of imagining novel functionalities and novel refinements in audio signal processing processes thanks to the pertinence, precision and stability of the results of the measurements obtained by this process.

It appears that the process for measuring an audio signal offers clearly improved performance and stability, and that it makes it possible to simplify current acquisition and measurement technologies while very clearly improving the levels of the characteristics of the audio processing processes.

Moreover, the use of this process can be contemplated in all fields requiring a detection and a qualification by a fast and precise measurement of a complex audiofrequency signal (telecommunications, medical, aeronautics, music, acoustics, etc.). This makes possible at best a clear improvement in the performances and uses of the equipment in question and at worst an excellent optimization of the precisions and stabilities of the performances of this equipment.

The invention claimed is:

1. Process for measuring peak and power values of an audiofrequency signal S, comprising digitizing the audiofrequency signal S, calibrating the digitized signal in a master template compatible with a perimeter of measurement needed for managing audio processing, wherein the process additionally comprises:

determining update instants of measurements of the audiofrequency signal based on a criterion associated with a value of the audiofrequency signal, acquiring representative peak and power measurements of the audiofrequency signal digitized and calibrated according to the update instants of the measurements of the audiofrequency signal.

2. Process in accordance with claim 1, further comprising: optimizing measurement fastness according to the digitized and calibrated audiofrequency signal.

3. Process in accordance with claim 1, further comprising: setting of a fast sequence of measurement of the peak of the digitized and calibrated audiofrequency signal.

4. Process in accordance with claim 1, further comprising: setting of a fast sequence of measurement of the power of the digitized and calibrated audiofrequency signal.

5. Process in accordance with claim 1, further comprising: optimizing a pertinence of the measurement on the digitized and calibrated audiofrequency signal of a broad band and a large dynamic range.

6. Process in accordance with claim 1, further comprising: restoring the peak and power measurements in synchronism with the original audiofrequency signal S.

7. Process in accordance with claim 1, wherein the digitizing of the original signal S (step 101) is done by formatting the original audiofrequency signal S as a flux inter-IC-sound (I2S) at 192 kHz.

8. Process in accordance with claim 1, wherein the calibrating comprises:

using a low-pass-type filter circuit with a finite impulse response type filter, using a high-pass-type filter circuit with an infinite impulse response type filter.

9. Process in accordance with claim 1, wherein in the determining of the update instants of the measurements, any passage to zero of the digitized and calibrated audiofrequency signal $S_{I2s\text{-}C}$ is detected, and an instant during which this state occurs is stored as one of the update instants of the measurements.

10. Process in accordance with claim 3, wherein in setting of the fast peak measurement sequence, the digitized and calibrated audio signal $S_{I2s\text{-}C}$ is rectified in order to obtain only positive alternations, peak measurements are synchronized on passages to zero of the digitized and calibrated audiofrequency signal $S_{I2s\text{-}C}$ by storing a peak of the signal on a half-alternation preceding an update instant of the peak measurement.

11. Process in accordance with claim 4, wherein in setting of the fast sequence of measuring the power of the audiofrequency signal, squares of the digitized and calibrated signal $S_{I2s\text{-}C}$ are cumulated, for a given duration, by storing a cumulation time, the power measurements are synchronized on passages to zero of the digitized and calibrated audiofrequency signal $S_{I2s\text{-}C}$ by storing the cumulation of squares and a duration on a half-alternation preceding the update instant of the power measurement.

12. Process in accordance with claim 1, wherein in acquiring representative measurements of the audio signal, according to update instants of the audiofrequency signal, peak levels of the audiofrequency signal and an instantaneous power of the audiofrequency signal are calculated in a synchronized manner, and in that the power is measured by calculating a square root of a ratio of a cumulation of squares to a time of a half-alternation.

13. Process in accordance with claim 2, wherein in optimizing the fastness of the measurement according to the audiofrequency signal, measurements of peaks and results of power calculations of a last X alternations are stored, a test is then implemented based on a decision criterion, implying that the measurement that is retained is made up of a maximum value, between a partial measurement value during the calculation (instant T) and a value of a measurement of the preceding half-alternation.

14. Process in accordance with claim 5, wherein in optimizing the pertinence of the measurement on the broad-band audiofrequency signal of a large dynamic range:

a table of measurements is used, preserving traceability of a last M measurements of half-alternations, for peaks, a maximum measurement of the table is always preserved, for power, power is calculated on the entire table by taking a square root of a ratio of a cumulation of squares of the audiofrequency signal to the time of the period, measurement of a time of a last validated half-alternation (Tv) is preserved, a conditional function is used such that if a new measurement represents a time T less than half Tv, then M is increased by 1; if not, M is reinitialized to 1 and an entirely new measurement is initiated.

15. Process in accordance with claim 6, wherein in restoring the measurement values in synchronism with the original audiofrequency signal, a timing clock used for digitizing the original audiofrequency signal is used to arrange markers making it possible to identify and to synchronize tables of the measurements with the original digitized audiofrequency signal $S_{i2s}$.

16. Computer program product comprising program code instructions recorded on a tangible medium readable by a computer for implementing the steps of the process in accordance with claim 1 when said program runs on a computer.

* * * * *